(12) United States Patent
Zhang et al.

(10) Patent No.: US 9,275,657 B1
(45) Date of Patent: Mar. 1, 2016

(54) PROCESS FOR MAKING PMR WRITER WITH NON-CONFORMAL SIDE GAPS

(71) Applicant: Western Digital (Fremont), LLC, Fremont, CA (US)

(72) Inventors: Jinqiu Zhang, Fremont, CA (US); Feng Liu, San Ramon, CA (US); Xiaoyu Yang, Union City, CA (US); Ming Jiang, San Jose, CA (US); Xiaotian Zhou, Fremont, CA (US); Zeyu Ma, Dublin, CA (US); Hai Sun, Milpitas, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 14/046,790

(22) Filed: Oct. 4, 2013

Related U.S. Application Data

(60) Provisional application No. 61/865,666, filed on Aug. 14, 2013.

(51) Int. Cl.
*G11B 5/187* (2006.01)
*G11B 5/127* (2006.01)
(Continued)

(52) U.S. Cl.
CPC ............. *G11B 5/1278* (2013.01); *G11B 5/10* (2013.01); *G11B 5/187* (2013.01); *G11B 5/1874* (2013.01); *G11B 5/232* (2013.01); *G11B 5/315* (2013.01); *G11B 5/3146* (2013.01); *G11B 5/147* (2013.01); *G11B 5/1878* (2013.01); *G11B 5/313* (2013.01); *G11B 5/3163* (2013.01);
(Continued)

(58) Field of Classification Search
CPC ........ G11B 5/187; G11B 5/10; G11B 5/1278; G11B 5/1878; G11B 5/147; G11B 5/313; G11B 5/315; G11B 5/3146; G11B 5/3163; G11B 5/1874; G11B 5/232; H01L 21/0272; H01L 21/32134; H01L 21/32139; Y10T 29/49032; Y10T 29/49041; Y10T 29/49043
USPC ............... 29/603.07, 603.12, 603.13, 603.14, 29/603.16; 216/41, 47, 48, 96; 360/119.07, 119.1, 125.03, 125.11, 360/125.15, 317
See application file for complete search history.

(56) References Cited

U.S. PATENT DOCUMENTS 5,277,749 A * 1/1994 Griffith et al. .............. 216/47 X
5,386,332 A * 1/1995 Jagielinski et al. ...... 360/119.07
(Continued)

FOREIGN PATENT DOCUMENTS

JP          2006331612 A  *  12/2006

OTHER PUBLICATIONS

Mallary et al., "One Terabit per Square Inch Perpendicular Recording Conceptual Design", IEEE Transactions on Magnetics, vol. 38, No. 4, Jul. 2002, pp. 1719-1724.
(Continued)

*Primary Examiner* — A. Dexter Tugbang

(57) ABSTRACT

A process for manufacturing a PMR writer main pole with non-conformal side gaps is provided. The process may include depositing a stitch layer comprising a magnetic material and a second stitch layer material over a substrate, forming an air-bearing surface (ABS) region in a first damascene material, and forming a yoke region in a second damascene material. The first damascene material may include Aluminum Oxide (Al2O3). The second damascene material may include Silicon Dioxide (SiO2). Side gap regions may include SiO2.

12 Claims, 13 Drawing Sheets

(51) Int. Cl.
*G11B 5/23* (2006.01)
*G11B 5/10* (2006.01)
*H01L 21/027* (2006.01)
*H01L 21/3213* (2006.01)
*G11B 5/147* (2006.01)
*G11B 5/31* (2006.01)

(52) U.S. Cl.
CPC ...... *H01L 21/0272* (2013.01); *H01L 21/32134* (2013.01); *H01L 21/32139* (2013.01); *Y10T 29/49032* (2015.01); *Y10T 29/49041* (2015.01); *Y10T 29/49043* (2015.01)

(56) References Cited

U.S. PATENT DOCUMENTS

| | | |
|---|---|---|
| 5,801,910 A | 9/1998 | Mallary |
| 6,016,290 A | 1/2000 | Chen et al. |
| 6,018,441 A | 1/2000 | Wu et al. |
| 6,025,978 A | 2/2000 | Hoshi et al. |
| 6,025,988 A | 2/2000 | Yan |
| 6,032,353 A | 3/2000 | Hiner et al. |
| 6,033,532 A | 3/2000 | Minami |
| 6,034,851 A | 3/2000 | Zarouri et al. |
| 6,043,959 A | 3/2000 | Crue et al. |
| 6,046,885 A | 4/2000 | Aimonetti et al. |
| 6,049,650 A | 4/2000 | Jerman et al. |
| 6,055,138 A | 4/2000 | Shi |
| 6,058,094 A | 5/2000 | Davis et al. |
| 6,073,338 A | 6/2000 | Liu et al. |
| 6,078,479 A | 6/2000 | Nepela et al. |
| 6,081,499 A | 6/2000 | Berger et al. |
| 6,094,803 A | 8/2000 | Carlson et al. |
| 6,099,362 A | 8/2000 | Viches et al. |
| 6,103,073 A | 8/2000 | Thayamballi |
| 6,108,166 A | 8/2000 | Lederman |
| 6,118,629 A | 9/2000 | Huai et al. |
| 6,118,638 A | 9/2000 | Knapp et al. |
| 6,125,018 A | 9/2000 | Takagishi et al. |
| 6,130,779 A | 10/2000 | Carlson et al. |
| 6,134,089 A | 10/2000 | Barr et al. |
| 6,136,166 A | 10/2000 | Shen et al. |
| 6,137,661 A | 10/2000 | Shi et al. |
| 6,137,662 A | 10/2000 | Huai et al. |
| 6,160,684 A | 12/2000 | Heist et al. |
| 6,163,426 A | 12/2000 | Nepela et al. |
| 6,166,891 A | 12/2000 | Lederman et al. |
| 6,172,848 B1 | 1/2001 | Santini |
| 6,173,486 B1 | 1/2001 | Hsiao et al. |
| 6,175,476 B1 | 1/2001 | Huai et al. |
| 6,178,066 B1 | 1/2001 | Barr |
| 6,178,070 B1 * | 1/2001 | Hong et al. ............... 360/317 |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,483,662 B1 | 11/2002 | Thomas et al. |
| 6,487,040 B1 | 11/2002 | Hsiao et al. |

(56) References Cited

U.S. PATENT DOCUMENTS

| | | |
|---|---|---|
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,675 B1 | 1/2003 | Shukh et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,560,076 B1 | 5/2003 | Yazawa et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |
| 6,661,625 B1 | 12/2003 | Sin et al. |
| 6,674,610 B1 | 1/2004 | Thomas et al. |
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |
| 6,707,083 B1 | 3/2004 | Hiner et al. |
| 6,710,973 B2 | 3/2004 | Okada et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,722,018 B2 | 4/2004 | Santini |
| 6,724,569 B1 | 4/2004 | Chen et al. |
| 6,724,572 B1 | 4/2004 | Stoev et al. |
| 6,729,015 B2 | 5/2004 | Matono et al. |
| 6,731,460 B2 | 5/2004 | Sasaki |
| 6,735,850 B1 | 5/2004 | Gibbons et al. |
| 6,737,281 B1 | 5/2004 | Dang et al. |
| 6,738,223 B2 | 5/2004 | Sato et al. |
| 6,744,608 B1 | 6/2004 | Sin et al. |
| 6,747,301 B1 | 6/2004 | Hiner et al. |
| 6,751,055 B1 | 6/2004 | Alfoqaha et al. |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,762,911 B2 | 7/2004 | Sasaki et al. |
| 6,765,756 B1 | 7/2004 | Hong et al. |
| 6,775,902 B1 | 8/2004 | Huai et al. |
| 6,778,358 B1 | 8/2004 | Jiang et al. |
| 6,781,927 B1 | 8/2004 | Heanuc et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,813,116 B2 | 11/2004 | Nakamura et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,834,010 B1 | 12/2004 | Qi et al. |
| 6,852,472 B2 * | 2/2005 | Lee et al. .................. 216/96 X |
| 6,857,181 B2 | 2/2005 | Lo et al. |
| 6,859,343 B1 | 2/2005 | Alfoqaha et al. |
| 6,859,997 B1 | 3/2005 | Tong et al. |
| 6,861,937 B1 | 3/2005 | Feng et al. |
| 6,870,712 B2 | 3/2005 | Chen et al. |
| 6,873,494 B2 | 3/2005 | Chen et al. |
| 6,873,547 B1 | 3/2005 | Shi et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,697 B2 | 5/2005 | Nakamura et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,903,900 B2 | 6/2005 | Sato et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,944,938 B1 | 9/2005 | Crue, Jr. et al. |
| 6,947,255 B2 | 9/2005 | Hsiao et al. |
| 6,947,258 B1 | 9/2005 | Li |
| 6,950,266 B1 | 9/2005 | McCaslin et al. |
| 6,950,277 B1 | 9/2005 | Nguy et al. |
| 6,952,325 B2 | 10/2005 | Sato et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,987,643 B1 | 1/2006 | Seagle |
| 6,989,962 B1 | 1/2006 | Dong et al. |
| 6,989,972 B1 | 1/2006 | Stoev et al. |
| 6,995,949 B2 | 2/2006 | Nakamura et al. |
| 7,002,775 B2 | 2/2006 | Hsu et al. |
| 7,006,326 B2 | 2/2006 | Okada et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,041,985 B1 | 5/2006 | Wang et al. |
| 7,046,490 B1 | 5/2006 | Ueno et al. |
| 7,054,113 B1 | 5/2006 | Seagle et al. |
| 7,057,857 B1 | 6/2006 | Niu et al. |
| 7,059,868 B1 | 6/2006 | Yan |
| 7,070,698 B2 | 7/2006 | Le |
| 7,092,195 B1 | 8/2006 | Liu et al. |
| 7,100,266 B2 | 9/2006 | Plumer et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |

(56) References Cited

U.S. PATENT DOCUMENTS

| | | | |
|---|---|---|---|
| 7,126,790 B1 | 10/2006 | Liu et al. |
| 7,131,346 B1 | 11/2006 | Buttar et al. |
| 7,133,252 B2 | 11/2006 | Takano et al. |
| 7,133,253 B1 | 11/2006 | Seagle et al. |
| 7,134,185 B1 | 11/2006 | Knapp et al. |
| 7,139,153 B2 | 11/2006 | Hsiao et al. |
| 7,154,715 B2 | 12/2006 | Yamanaka et al. |
| 7,159,302 B2 | 1/2007 | Feldbaum et al. |
| 7,170,725 B1 | 1/2007 | Zhou et al. |
| 7,177,117 B1 | 2/2007 | Jiang et al. |
| 7,185,415 B2 | 3/2007 | Khera et al. |
| 7,193,815 B1 | 3/2007 | Stoev et al. |
| 7,196,880 B1 | 3/2007 | Anderson et al. |
| 7,199,974 B1 | 4/2007 | Alfoqaha |
| 7,199,975 B1 | 4/2007 | Pan |
| 7,206,166 B2 | 4/2007 | Notsuke et al. |
| 7,211,339 B1 | 5/2007 | Seagle et al. |
| 7,212,379 B2 | 5/2007 | Hsu et al. |
| 7,212,384 B1 | 5/2007 | Stoev et al. |
| 7,238,292 B1 | 7/2007 | He et al. |
| 7,239,478 B1 | 7/2007 | Sin et al. |
| 7,245,454 B2 | 7/2007 | Aoki et al. |
| 7,248,431 B1 | 7/2007 | Liu et al. |
| 7,248,433 B1 | 7/2007 | Stoev et al. |
| 7,248,449 B1 | 7/2007 | Seagle |
| 7,251,878 B2 | 8/2007 | Le et al. |
| 7,253,992 B2 | 8/2007 | Chen et al. |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,338 B2 | 11/2007 | Le et al. |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,318,947 B1 | 1/2008 | Park et al. |
| 7,324,304 B1 | 1/2008 | Benakli et al. |
| 7,333,295 B1 | 2/2008 | Medina et al. |
| 7,337,530 B1 | 3/2008 | Stoev et al. |
| 7,342,752 B1 | 3/2008 | Zhang et al. |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,367,112 B2 | 5/2008 | Nix et al. |
| 7,369,359 B2 | 5/2008 | Fujita et al. |
| 7,371,152 B1 | 5/2008 | Newman |
| 7,372,665 B1 | 5/2008 | Stoev et al. |
| 7,375,926 B1 | 5/2008 | Stoev et al. |
| 7,379,269 B1 | 5/2008 | Krounbi et al. |
| 7,386,933 B1 | 6/2008 | Krounbi et al. |
| 7,389,577 B1 | 6/2008 | Shang et al. |
| 7,392,577 B2 | 7/2008 | Yazawa et al. |
| 7,417,832 B1 | 8/2008 | Erickson et al. |
| 7,419,891 B1 | 9/2008 | Chen et al. |
| 7,428,124 B1 | 9/2008 | Song et al. |
| 7,430,095 B2 | 9/2008 | Benakli et al. |
| 7,430,098 B1 | 9/2008 | Song et al. |
| 7,436,620 B1 | 10/2008 | Kang et al. |
| 7,436,638 B1 | 10/2008 | Pan |
| 7,440,220 B1 | 10/2008 | Kang et al. |
| 7,441,325 B2 | 10/2008 | Gao et al. |
| 7,443,632 B1 | 10/2008 | Stoev et al. |
| 7,444,740 B1* | 11/2008 | Chung et al. ............... 29/603.16 |
| 7,464,457 B2 | 12/2008 | Le et al. |
| 7,467,461 B2 | 12/2008 | Bonhote et al. |
| 7,469,467 B2 | 12/2008 | Gao et al. |
| 7,493,688 B1 | 2/2009 | Wang et al. |
| 7,508,626 B2 | 3/2009 | Ichihara et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,535,675 B2 | 5/2009 | Kimura et al. |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,558,019 B1 | 7/2009 | Le et al. |
| 7,580,222 B2 | 8/2009 | Sasaki et al. |
| 7,583,466 B2 | 9/2009 | Kermiche et al. |
| 7,595,967 B1 | 9/2009 | Moon et al. |
| 7,639,451 B2 | 12/2009 | Yatsu et al. |
| 7,639,452 B2 | 12/2009 | Mochizuki et al. |
| 7,639,457 B1 | 12/2009 | Chen et al. |
| 7,643,246 B2 | 1/2010 | Yazawa et al. |
| 7,649,712 B2 | 1/2010 | Le et al. |
| 7,660,080 B1 | 2/2010 | Liu et al. |
| 7,663,839 B2 | 2/2010 | Sasaki et al. |
| 7,672,079 B2 | 3/2010 | Li et al. |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |
| 7,715,152 B2 | 5/2010 | Okada et al. |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,748,104 B2 | 7/2010 | Bonhote et al. |
| 7,768,743 B2 | 8/2010 | Guthrie et al. |
| 7,785,666 B1 | 8/2010 | Sun et al. |
| 7,796,356 B1 | 9/2010 | Fowler et al. |
| 7,796,360 B2 | 9/2010 | Im et al. |
| 7,796,361 B2 | 9/2010 | Sasaki et al. |
| 7,800,858 B1 | 9/2010 | Bajikar et al. |
| 7,819,979 B1 | 10/2010 | Chen et al. |
| 7,829,264 B1 | 11/2010 | Wang et al. |
| 7,841,068 B2 | 11/2010 | Chen et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,889,456 B2 | 2/2011 | Jiang et al. |
| 7,894,159 B2 | 2/2011 | Lengsfield, III et al. |
| 7,898,773 B2 | 3/2011 | Han et al. |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,425 B2 | 3/2011 | Sasaki et al. |
| 7,916,426 B2 | 3/2011 | Hu et al. |
| 7,918,013 B1 | 4/2011 | Dunn et al. |
| 7,920,359 B2 | 4/2011 | Maruyama et al. |
| 7,924,528 B2 | 4/2011 | Sasaki et al. |
| 7,968,219 B1 | 6/2011 | Jiang et al. |
| 7,979,978 B2 | 7/2011 | Han et al. |
| 7,982,989 B1 | 7/2011 | Shi et al. |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,027,125 B2 | 9/2011 | Lee et al. |
| 8,031,433 B2* | 10/2011 | Yan et al. ............... 360/125.03 |
| 8,056,213 B2* | 11/2011 | Han et al. ............... 29/603.16 |
| 8,066,892 B2 | 11/2011 | Guthrie et al. |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |

(56) References Cited

U.S. PATENT DOCUMENTS

| | | |
|---|---|---|
| 8,104,166 B1 | 1/2012 | Zhang et al. |
| 8,116,033 B2 | 2/2012 | Kameda et al. |
| 8,116,043 B2 | 2/2012 | Leng et al. |
| 8,116,171 B1 | 2/2012 | Lee |
| 8,117,738 B2 | 2/2012 | Han et al. |
| 8,120,874 B2 | 2/2012 | Hsiao et al. |
| 8,125,732 B2 | 2/2012 | Bai et al. |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,852 B2 | 4/2012 | Lee et al. |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,184,399 B2 | 5/2012 | Wu et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,233 B1 | 7/2012 | Shen et al. |
| 8,233,234 B2 | 7/2012 | Hsiao et al. |
| 8,233,235 B2 | 7/2012 | Chen et al. |
| 8,233,248 B1 | 7/2012 | Li et al. |
| 8,248,728 B2 | 8/2012 | Yamaguchi et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,792 B2 | 9/2012 | Bai et al. |
| 8,264,797 B2 | 9/2012 | Emley |
| 8,264,798 B1 | 9/2012 | Guan et al. |
| 8,270,109 B2 | 9/2012 | Ohtsu |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,649 B2 | 10/2012 | Sasaki et al. |
| 8,289,821 B1 | 10/2012 | Huber |
| 8,291,743 B1 | 10/2012 | Shi et al. |
| 8,305,711 B2 | 11/2012 | Li et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,347,488 B2 | 1/2013 | Hong et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,381,391 B2 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |
| 8,404,128 B1 | 3/2013 | Zhang et al. |
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |
| 8,422,841 B1 | 4/2013 | Shi et al. |
| 8,424,192 B1 | 4/2013 | Yang et al. |
| 8,432,637 B2 | 4/2013 | Bonhote et al. |
| 8,441,756 B1 | 5/2013 | Sun et al. |
| 8,441,757 B2 | 5/2013 | Chen et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,778 B2 | 6/2013 | Min et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,470,186 B2 | 6/2013 | Chen et al. |
| 8,472,288 B1 | 6/2013 | Wolf et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,508,886 B2 | 8/2013 | Chen et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |

(56) References Cited

U.S. PATENT DOCUMENTS

| | | |
|---|---|---|
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 8,711,518 B1 | 4/2014 | Zeng et al. |
| 8,760,808 B2 | 6/2014 | Heim et al. |
| 8,792,208 B1 | 7/2014 | Liu et al. |
| 8,793,866 B1 | 8/2014 | Zhang et al. |
| 2003/0076630 A1 | 4/2003 | Sato et al. |
| 2004/0061988 A1 | 4/2004 | Matono et al. |
| 2004/0184191 A1 | 9/2004 | Ichihara et al. |
| 2005/0117251 A1 | 6/2005 | Matono et al. |
| 2006/0044677 A1 | 3/2006 | Li et al. |
| 2006/0044681 A1 | 3/2006 | Le et al. |
| 2006/0044682 A1 | 3/2006 | Le et al. |
| 2006/0067005 A1 | 3/2006 | Jayasekara |
| 2006/0082924 A1 | 4/2006 | Etoh et al. |
| 2006/0158779 A1 | 7/2006 | Ota et al. |
| 2006/0174474 A1 | 8/2006 | Le |
| 2006/0225268 A1 | 10/2006 | Le et al. |
| 2006/0288565 A1 | 12/2006 | Le et al. |
| 2007/0211380 A1 | 9/2007 | Akimoto et al. |
| 2007/0236834 A1 | 10/2007 | Toma et al. |
| 2007/0247746 A1 | 10/2007 | Kim et al. |
| 2007/0253107 A1 | 11/2007 | Mochizuki et al. |
| 2007/0258167 A1 | 11/2007 | Allen et al. |
| 2007/0263324 A1 | 11/2007 | Allen et al. |
| 2007/0283557 A1 | 12/2007 | Chen et al. |
| 2008/0002309 A1 | 1/2008 | Hsu et al. |
| 2008/0151437 A1 | 6/2008 | Chen et al. |
| 2008/0180861 A1 | 7/2008 | Maruyama et al. |
| 2008/0253035 A1 | 10/2008 | Han et al. |
| 2008/0273276 A1 | 11/2008 | Guan |
| 2008/0273277 A1 | 11/2008 | Guan et al. |
| 2008/0278861 A1 | 11/2008 | Jiang et al. |
| 2008/0304186 A1 | 12/2008 | Watanabe et al. |
| 2009/0091861 A1 | 4/2009 | Takano et al. |
| 2009/0154019 A1 | 6/2009 | Hsiao et al. |
| 2009/0154026 A1 | 6/2009 | Jiang et al. |
| 2009/0168241 A1 | 7/2009 | Mochizuki et al. |
| 2009/0279206 A1 | 11/2009 | Yang et al. |
| 2010/0061016 A1 | 3/2010 | Han et al. |
| 2010/0146773 A1 | 6/2010 | Li et al. |
| 2010/0155363 A1 | 6/2010 | Pentek et al. |
| 2010/0165517 A1 | 7/2010 | Araki et al. |
| 2010/0254042 A1 | 10/2010 | Contreras et al. |
| 2010/0277832 A1 | 11/2010 | Bai et al. |
| 2010/0290157 A1 | 11/2010 | Zhang et al. |
| 2010/0302681 A1 | 12/2010 | Mino et al. |
| 2011/0051293 A1 | 3/2011 | Bai et al. |
| 2011/0086240 A1 | 4/2011 | Xiang et al. |
| 2011/0146060 A1 | 6/2011 | Han et al. |
| 2011/0151279 A1 | 6/2011 | Allen et al. |
| 2011/0222188 A1 | 9/2011 | Etoh et al. |
| 2012/0012555 A1 | 1/2012 | Yan et al. |
| 2012/0044598 A1 | 2/2012 | Bai et al. |
| 2012/0111826 A1 | 5/2012 | Chen et al. |
| 2012/0162811 A1 | 6/2012 | Ishibashi et al. |
| 2012/0216378 A1 | 8/2012 | Emley et al. |
| 2012/0237878 A1 | 9/2012 | Zeng et al. |
| 2012/0268845 A1 | 10/2012 | Sahoo et al. |
| 2012/0298621 A1 | 11/2012 | Gao |
| 2013/0216702 A1 | 8/2013 | Kaiser et al. |
| 2013/0216863 A1 | 8/2013 | Li et al. |
| 2013/0257421 A1 | 10/2013 | Shang et al. |
| 2014/0175050 A1 | 6/2014 | Zhang et al. |

OTHER PUBLICATIONS

U.S. Appl. No. 13/929,705, filed Jun. 27, 2013, to Zhang et al., 23 pages.

U.S. Appl. No. 13/898,160, filed May 20, 2013, to Zeng et al., 18 pages.

Feng Liu, et. al., U.S. Appl. No. 13/631,808, filed Sep. 28, 2012, 17 pages.

Ronghui Zhou, et. al., U.S. Appl. No. 13/711,160, filed Dec. 11, 2012, 28 pages.

* cited by examiner

Fig. 5
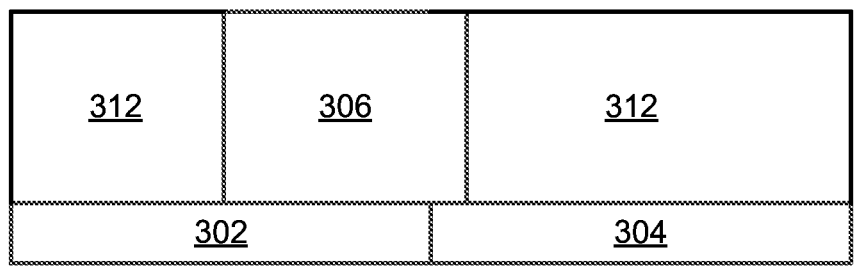
SIDE VIEW
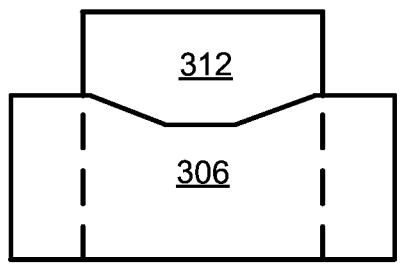
TOP VIEW

Fig. 6
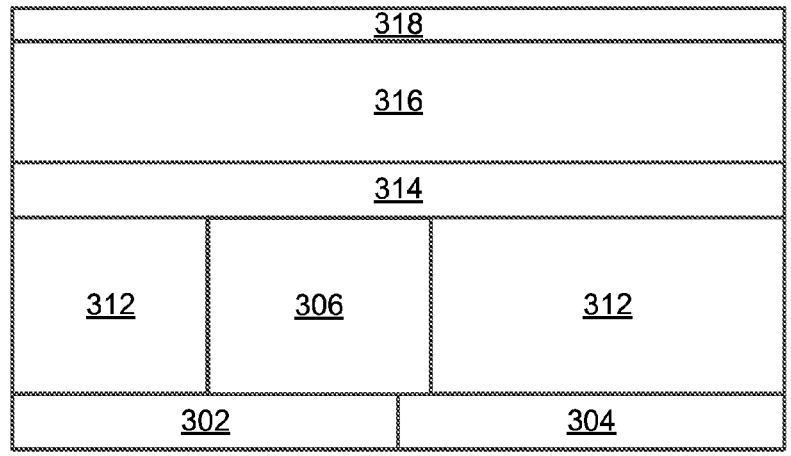
SIDE VIEW
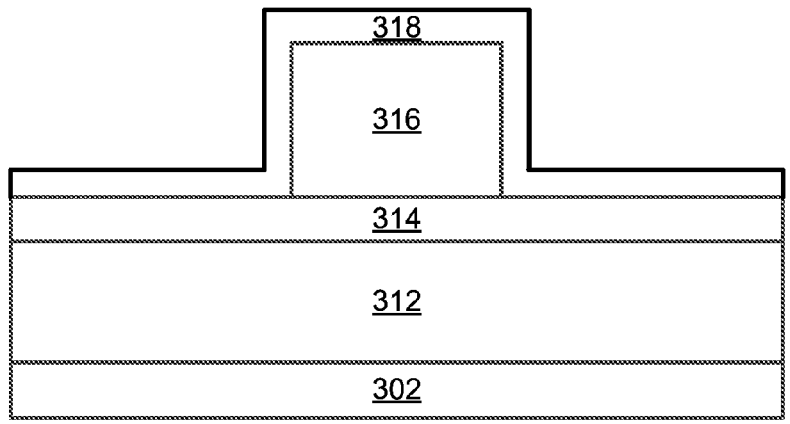
CROSS SECTION - YOKE VIEW
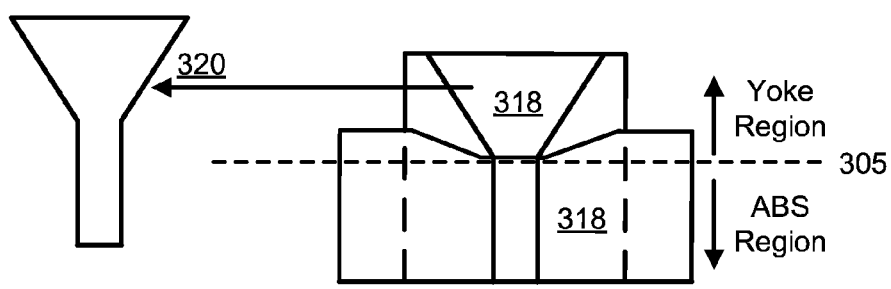
TOP VIEW

Fig. 7
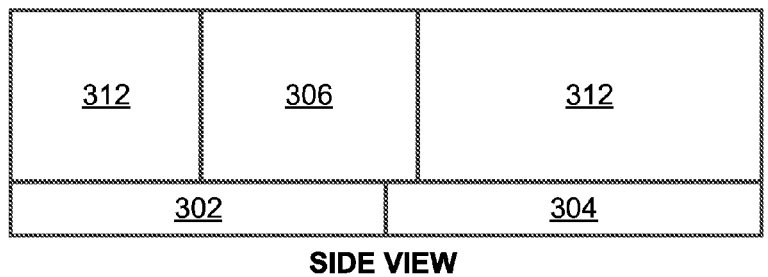
SIDE VIEW
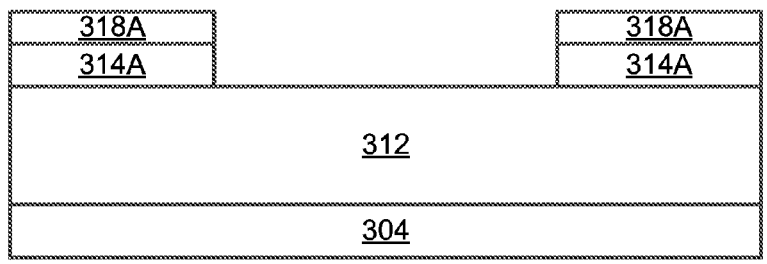
CROSS SECTION - ABS VIEW
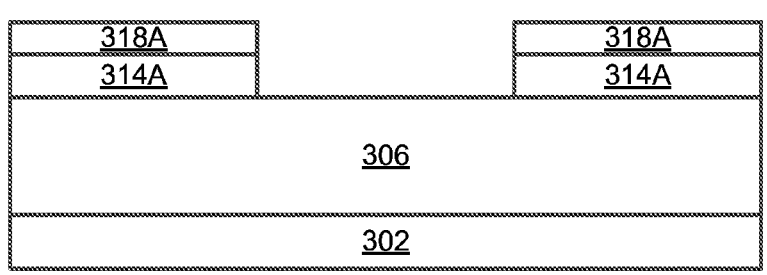
CROSS SECTION - YOKE VIEW
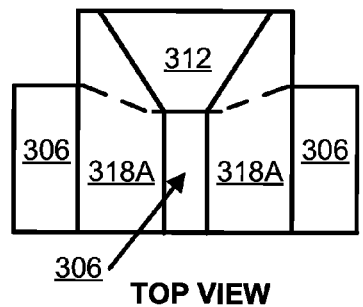
TOP VIEW

Fig. 8
SIDE VIEW
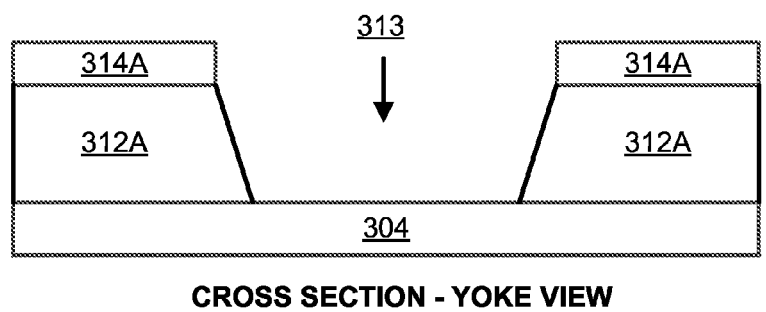
CROSS SECTION - YOKE VIEW
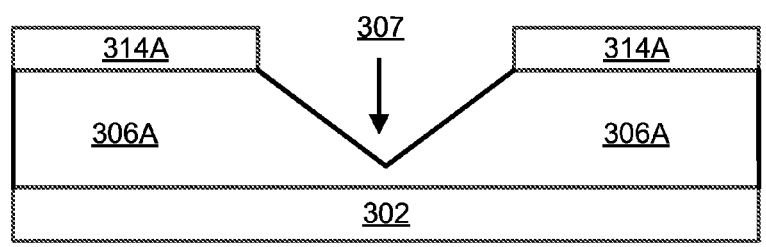
CROSS SECTION - ABS VIEW
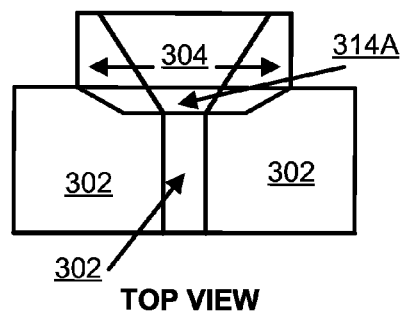
TOP VIEW

Fig. 9
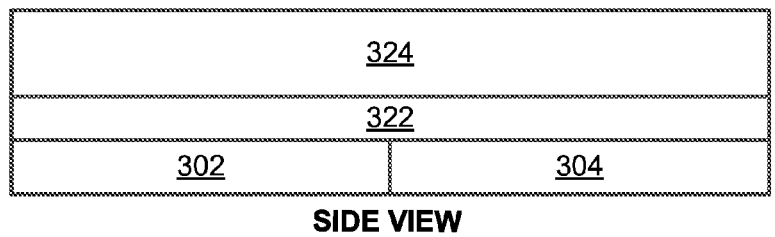
SIDE VIEW
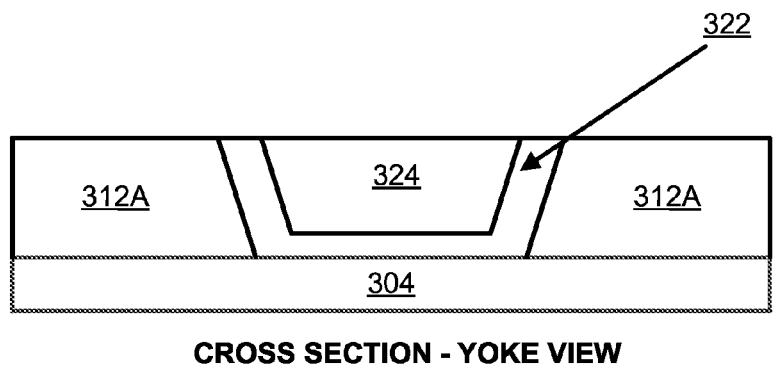
CROSS SECTION - YOKE VIEW
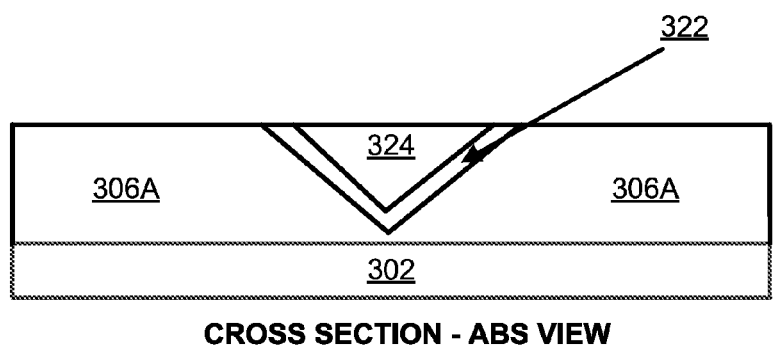
CROSS SECTION - ABS VIEW
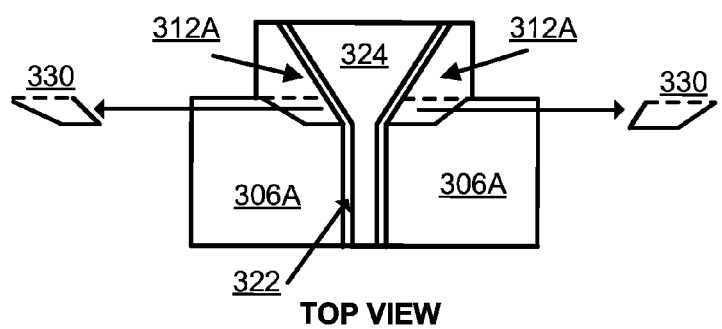
TOP VIEW

Fig. 10
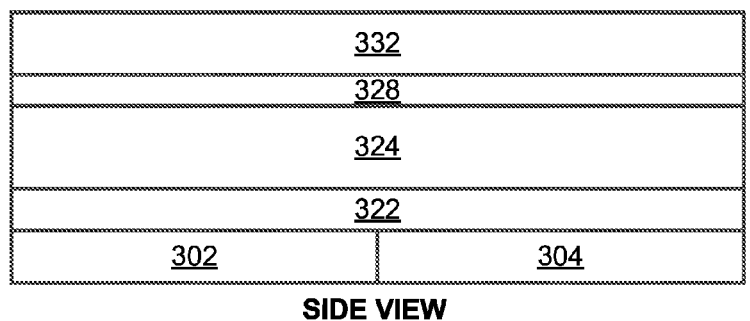
SIDE VIEW
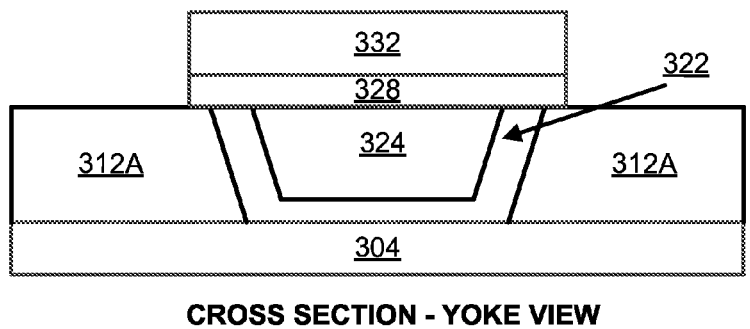
CROSS SECTION - YOKE VIEW
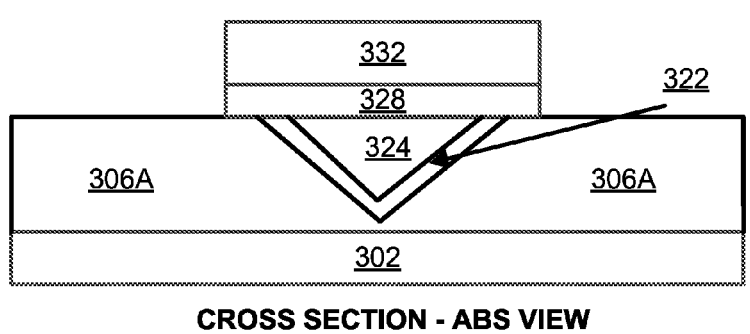
CROSS SECTION - ABS VIEW
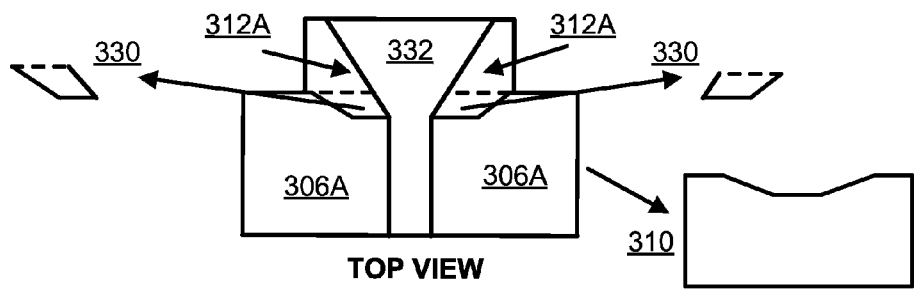
TOP VIEW

Fig. 11
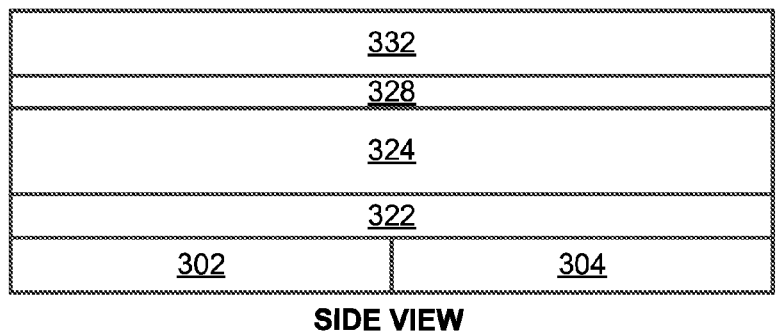
SIDE VIEW
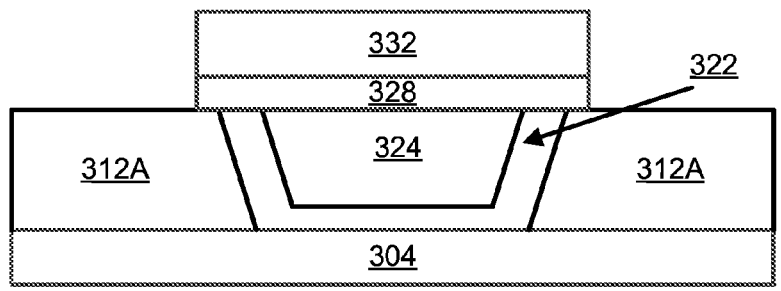
CROSS SECTION - YOKE VIEW
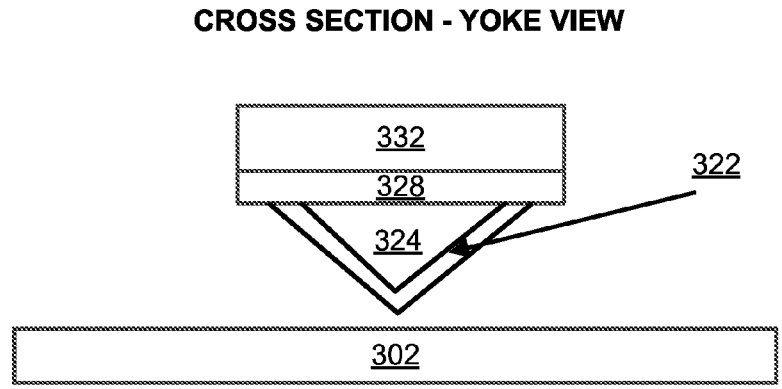
CROSS SECTION - ABS VIEW
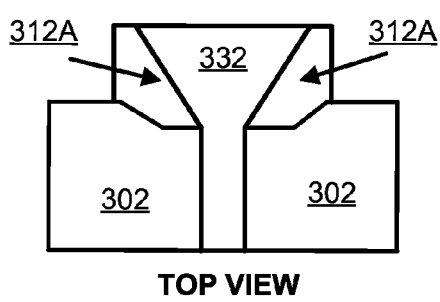
TOP VIEW

Fig. 12
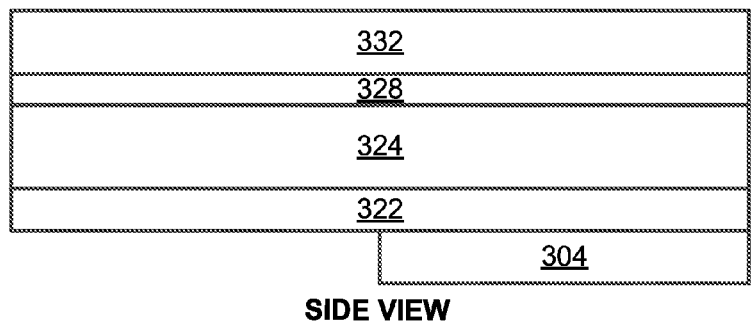
SIDE VIEW
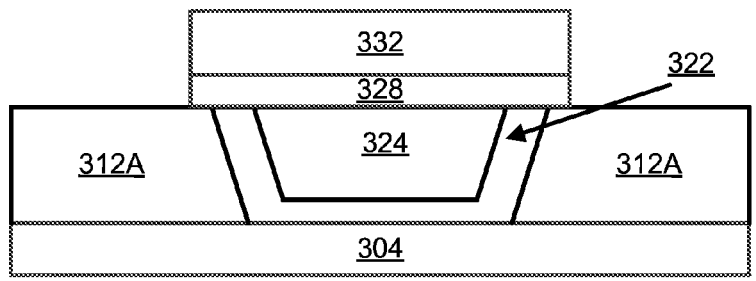
CROSS SECTION - YOKE VIEW
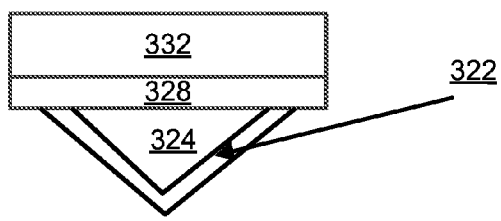
CROSS SECTION - ABS VIEW
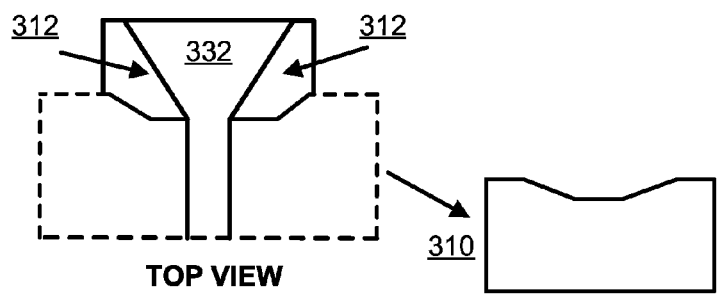
TOP VIEW

Fig. 13
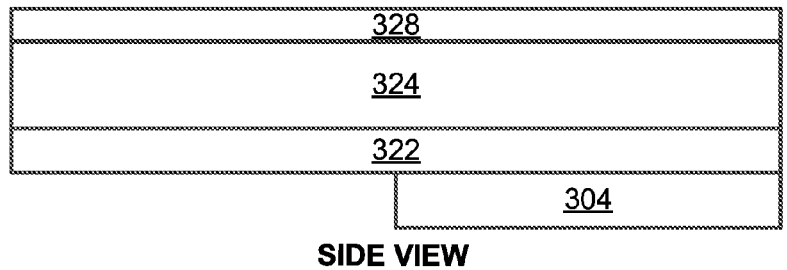
SIDE VIEW
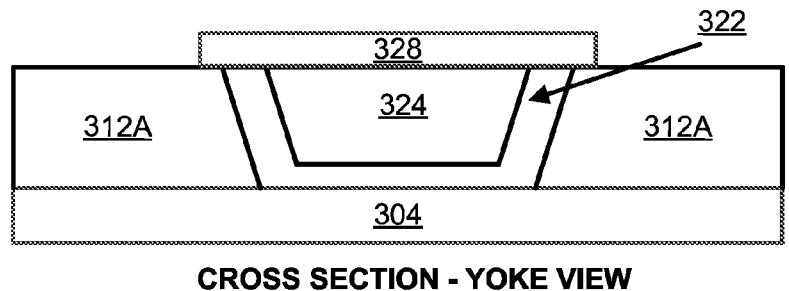
CROSS SECTION - YOKE VIEW
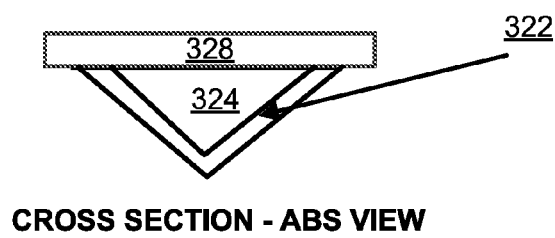
CROSS SECTION - ABS VIEW
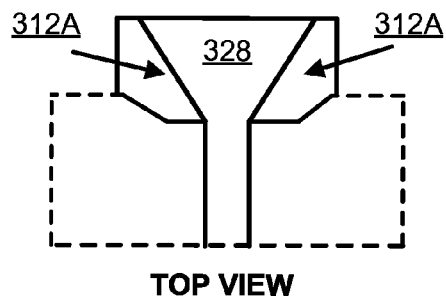
TOP VIEW

Fig. 14
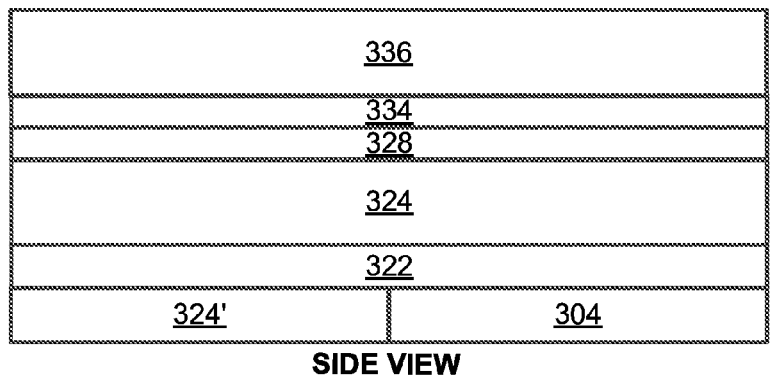
SIDE VIEW
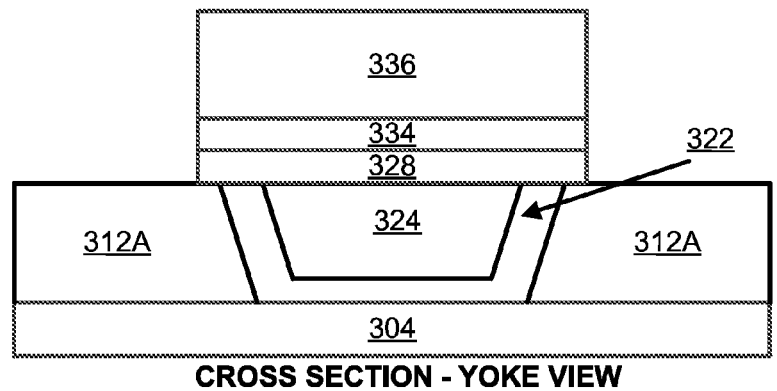
CROSS SECTION - YOKE VIEW
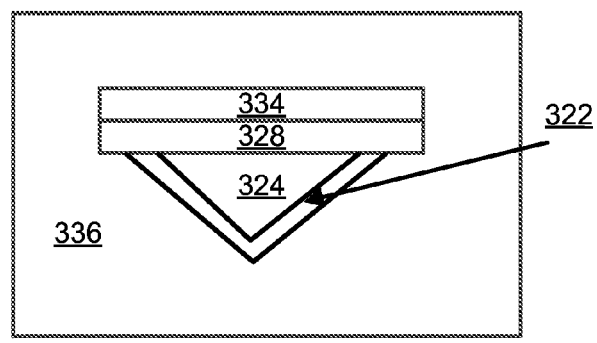
CROSS SECTION - ABS VIEW
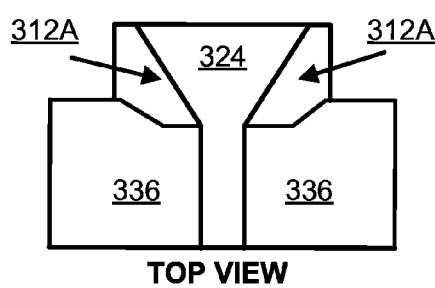
TOP VIEW

PROCESS FOR MAKING PMR WRITER WITH NON-CONFORMAL SIDE GAPS

CROSS-REFERENCE TO RELATED APPLICATIONS

This application claims priority to provisional U.S. Patent Application Ser. No. 61/865,666, filed on Aug. 14, 2013, which is hereby incorporated by reference in its entirety.

BACKGROUND

PMR systems have been developed to meet the growing demand for improved magnetic disk drive data rate and capacity. Damascene processes may be used to build up structures for use in a PMR writer head, as opposed to methods which rely upon material removal to form such structures. As applied to the formation of PMR writing heads, the damascene process involves forming trapezoidal trenches in a material, and then depositing (e.g., electroplating) a magnetic pole material into the trenches to form write poles. The PMR writer pole is the trapezoidal formation of the magnetic material deposited in the trapezoidal trench etched in a surrounding material.

With the ever increasing need for higher recording areal densities (for example, almost 1 TB/in2), improved processes for manufacturing PMR writers with wrap around shields (WAS) continue to be developed. Writer pole tip physical geometry may be decreased to meet the required magnetic pole write width and track pitch for higher areal density writers (e.g. Firebird and Barbados class).

However, such a geometry reduction may produce a significant write field and reverse overwrite loss. To avoid this problem, PMR writers with non-conformal side gaps may be fabricated. Accordingly, improved processes for manufacturing PMR writer heads with non-conformal side gaps are needed.

BRIEF DESCRIPTION OF THE DRAWINGS

The present application is illustrated by way of example, and not limitation, in the figures of the accompanying drawings in which:

FIGS. 3-14 are diagrams illustrating an exemplary embodiment of a PMR writer pole during fabrication in accordance with the process of FIG. 2.

DETAILED DESCRIPTION

In the following description, numerous specific details are set forth, such as examples of specific layer compositions and properties, to provide a thorough understanding of various embodiment of the preside sent invention. It will be apparent however, to one skilled in the art that these specific details need not be employed to practice various embodiments of the present invention. In other instances, well known components or methods have not been described in detail to avoid unnecessarily obscuring various embodiments of the present invention.

The terms "over," "under," "between," and "on" as used herein refer to a relative position of one media layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. By contrast, a first layer "on" a second layer is in contact with that second layer. Additionally, the relative position of one layer with respect to other layers is provided assuming operations are performed relative to a substrate without consideration of the absolute orientation of the substrate.

Figure 1:
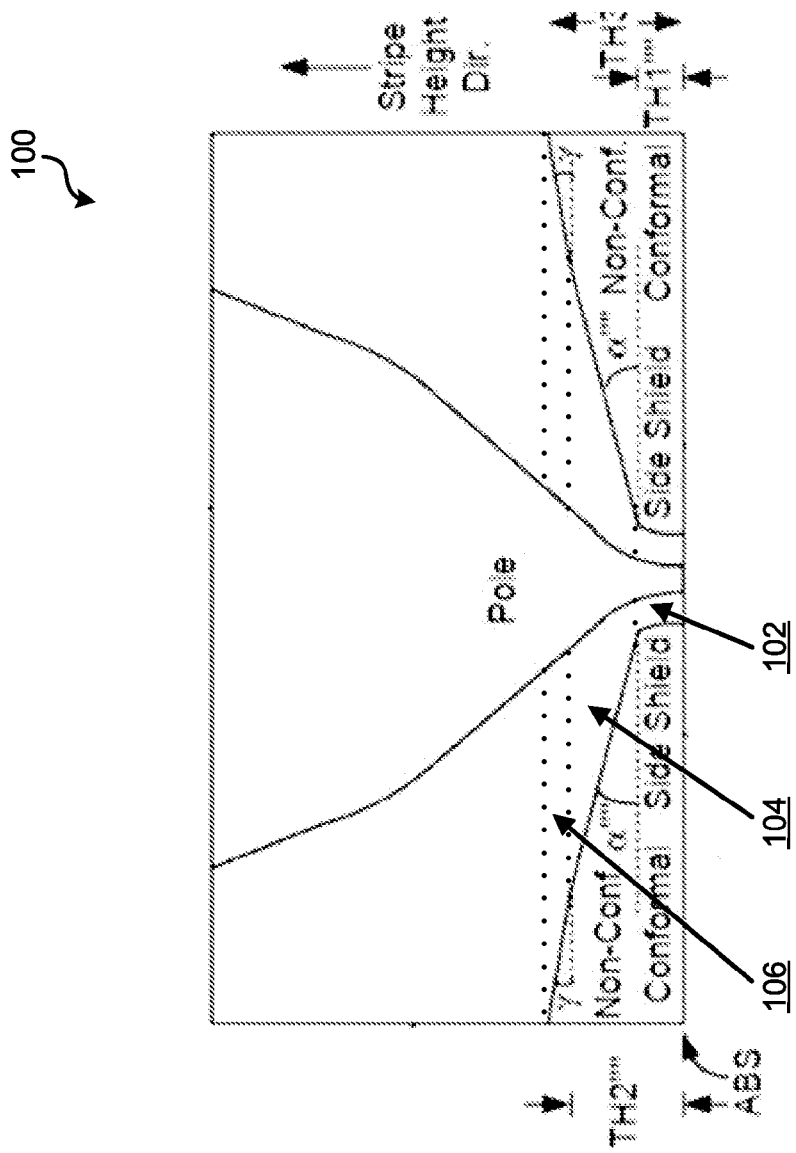
FIG. 1 illustrates a PMR writer pole with non-conformal side gaps that may be manufactured using the disclosed process.

FIG. 1 illustrates a top view of an example PMR writer pole 100 with non-conformal side gaps that may be manufactured using the disclosed process (described below). In a PMR write head with a non-conformal integrated side shield structure, the sidewalls of the side shield are not parallel to the sidewalls of the pole tip. Thus, the side gap distance between the pole tip edge and side shield is variable from the trailing to the lead edges of the pole tip. The presence of these side gaps may significantly improve on track writer performance (~2 dB or more ReOVW) by reducing side fringing. In the illustrated embodiment, the side gap increases with side shield throat height from the air-bearing surface (ABS) region to the yoke region of the writer pole. As illustrated by FIG. 1, the PMR writer pole may include a plurality of throat regions 102, 104 and 106. In any individual region, the side gap width may have a different variation. For example, in one embodiment, region 102 varies in width from approximately 10 nm to 20 nm, region two varies in width from approximately 10 nm to 60 nm, and region three varies in width from approximately 60 nm to 80 nm. In the illustrated embodiment, region 102 may correspond to the ABS region for the pole and regions 104 and 106 may correspond to a yoke region for the pole.

FIGS. 2-14 illustrate an exemplary process for fabricating a full wrap around shield (FWAS) PMR writer main pole with non-conformal side gaps as shown in FIG. 1. This process presents several benefits. The process manufactures PMR writer poles with non-conformal side gaps, which significantly improve on track writer. Additionally, this process manufactures trenches using operational requirements that are comparable to Aluminium Oxide (Al2O3) based processes. Moreover, this process helps reduce the manufacturing operations needed to manufacture hard drives with a recording areal density of approximately 700 Gb/in$^2$ and greater.

Figure 2:
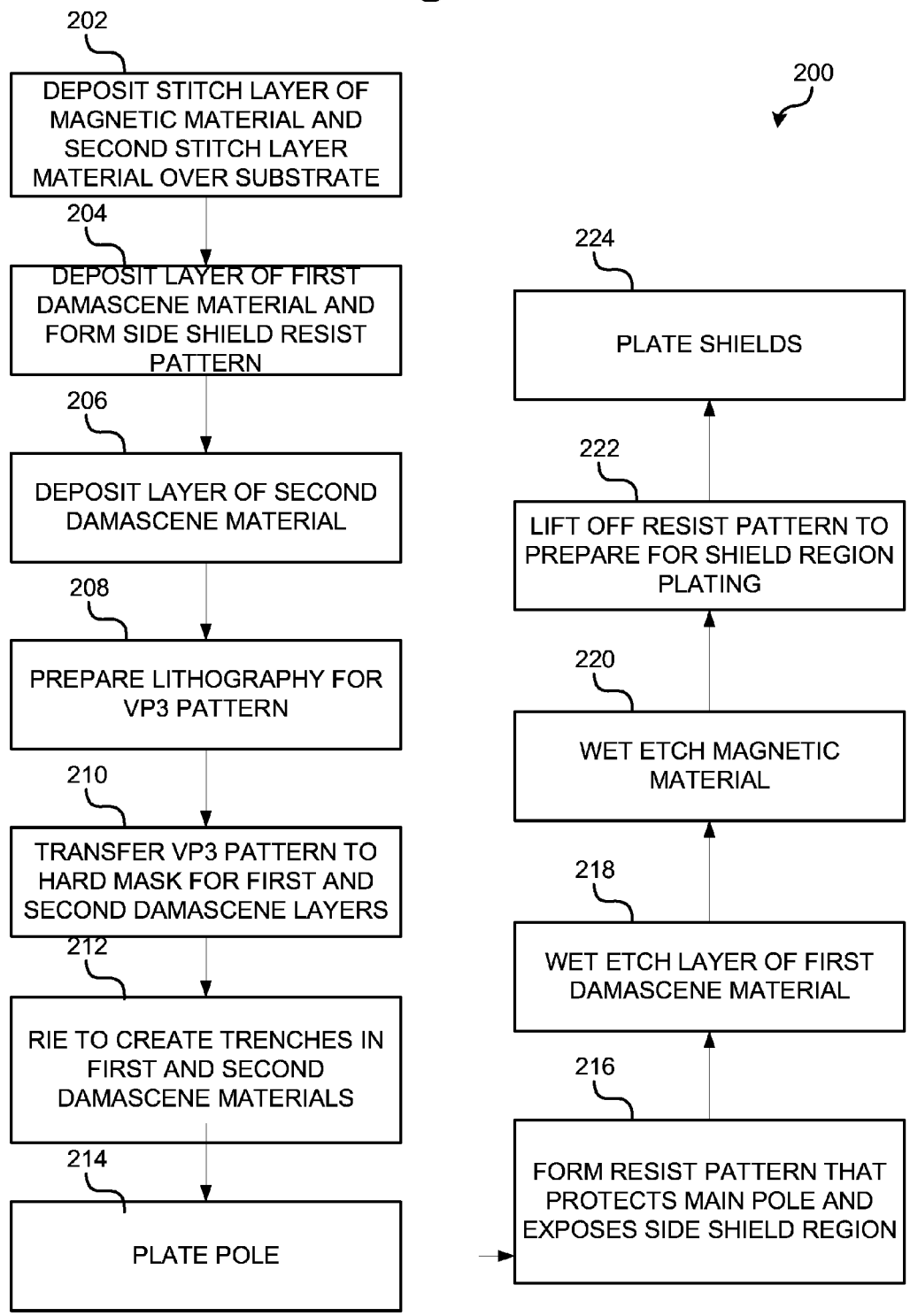
FIG. 2 is a flowchart describing a process used for manufacturing a PMR writer pole with non-conformal side gaps.
Figure 3:
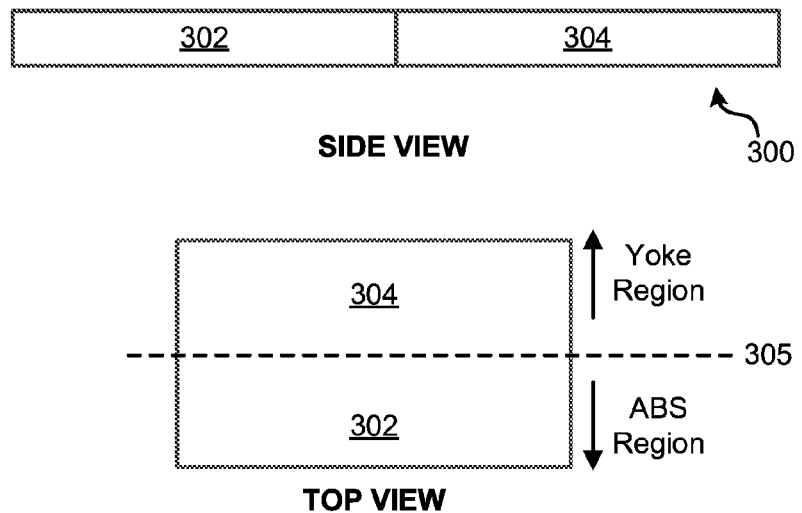
Figure 4:
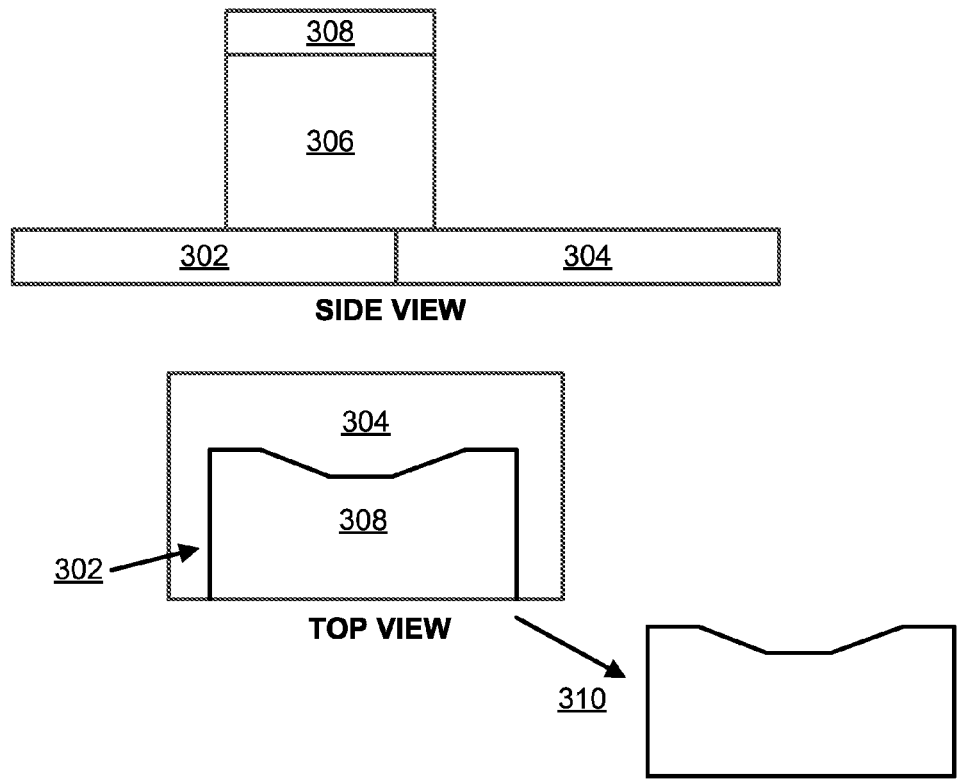

FIGS. 3-14 illustrate side, cross-sectional, and top views of the PMR pole after various process operations and will be described in conjunction with FIG. 2, which details the process operations themselves.

For simplicity, some process operations may be omitted. The PMR writer pole being fabricated may be part of a merged head that also includes a read head (not shown) and resides on a slider (not shown) in a disk drive. The process 200 also may commence after formation of other portions of the PMR writer pole.

At operation 202, a stitch layer comprising a magnetic material 302 and second stitch layer material 304 is deposited over a substrate 300. In the illustrated embodiment, the magnetic material 302 comprises a Nickel-Iron (NiFe) alloy and the second stitch layer material 304 comprises Ruthenium (Ru).

At operation 204, a first damascene layer 306 (or first layer of damascene material) is deposited and a side shield region 310 is formed in first damascene layer 306. Formation of side shield region 310 may be performed using any lithographic process such as photolithography. In the illustrated embodiment, the side shield region 310 is formed by depositing a hard mask 308 over the first damascene layer 306, depositing a side shield patterned photoresist (not pictured) over hard mask 308, etching hard mask 308, and then etching damascene layer 306. Hard mask layer 308 may comprise Chromium (Cr) or Ruthenium (Ru) or any other material that has a high etching selectivity with respect to the material being patterned, i.e. the material used in damascene layer 306. In the illustrated embodiment, first damascene layer 306 comprises Aluminium Oxide (Al2O3).

At operation 206, a second damascene layer 312 (or second layer of damascene material) is deposited and planarized. In one embodiment, planarization is performed using a chemical mechanical planarization (CMP) process. In another embodiment, planarization may be performed using an ion beam milling process. As illustrated by FIG. 5, planarization removes hard mask 308 and exposes first damascene layer 306. As illustrated in the side view, planarization may be used to level the top of the second damascene layer 312 with the first damascene layer 306. In this exemplary embodiment, the second damascene layer 312 comprises Silicon Dioxide (SiO2).

The structure is then prepared for a PMR main pole formation at operation 208. As illustrated by FIG. 6, the structure is prepared for a lithography process by depositing photo adhesion layer 314, a resist pattern layer 316, and hard mask 318. In the illustrated embodiment, resist pattern layer 316 has a writer main pole photo pattern (VP3 photo pattern) 320, which comprises a yoke and ABS pattern. Photo adhesion layer 314 may comprise Chromium (Cr) or Ruthenium (Ru) or any other material that has a high etching selectivity with respect to the material being patterned, i.e. the material used in the first damascene layer and the material used in the second damascene layer. Hard mask layer 318 may comprise Tantalum (Ta), Titanium (Ti), or any other material that has a high etching selectivity with respect to hard mask layer 314.

The first damascene layer 306 and second damascene layer 312 may later be etched (described below) to form a yoke and ABS region of a PMR main pole as indicated by pattern 320. The yoke region corresponds to the pole's yoke and may be etched out of the second damascene layer 312. The ABS region corresponds to the region from the ABS (i.e. pole tip) to the start of the yoke region (i.e. neck area of pole) and may be etched out of the first damascene layer 306. The separation boundary 305 between the yoke region and ABS region of the PMR pole (not yet etched) may be defined as the separation boundary between first damascene layer 306 and second damascene layer 312. Accordingly, the distance from the ABS to the separation boundary is the distance that the yoke region is from or behind the ABS. During a VP3 lithography (described below), the placement of a resist mask with pattern relative to the substrate may define the placement of the separation boundary. In some embodiments, the yoke region (separation boundary) may be 100 to 600 nm behind the ABS. In the embodiment illustrated by process 200, the yoke region is approximately 200 nm behind the ABS.

At operation 210, the VP3 Pattern is transferred to layer 314. In one exemplary embodiment, formation of the VP3 pattern in layer 314 proceeds as follows. Hard mask layer 318 is side milled to remove it from lateral sides of the resist pattern layer 316 (illustrated from the side views of FIGS. 6 and 7). Side milling exposes some portions (e.g. lateral sides) of the resist pattern layer 316 so that an etchant can access the layer during an etching operation. Resist pattern layer 316 and hard mask layer 318 may then be lifted off to transfer the ABS region and yoke region pattern from the resist pattern layer 316 to hard mask layer 318. This forms a corresponding ABS region and yoke region opening in layer 318. Thus, a hard mask layer 318A has been formed. Photo adhesion layer 314 is then etched using hard mask layer 318A as a hard mask. In this exemplary process a reactive ion etch (RIE) is performed. The RIE transfers the yoke and ABS region openings from hard mask layer 318A to photo adhesion layer 314. Thus, a layer 314A has been formed from hard mask 318A.

At operations 212-214, a PMR main pole is formed. At operation 212, the first damascene layer and the second damascene layer are etched using photo adhesion layer 314A as a hard mask. In this exemplary process a RIE process is performed. The RIE process may comprise one or more RIE operations. As illustrated in FIG. 8, the RIE forms a first damascene layer 306A and a second damascene layer 312A. First damascene layer 312A may have a trench opening 313 corresponding to the ABS region of the formed pole opening. Second damascene layer 306A may have a trench opening 307 corresponding to the yoke region of the formed pole opening.

The trenches may then be plated at operation 214. The plating operation 214 may include depositing a non-magnetic gap layer 322 in trenches 307 and 313, and over first damascene layer 306A and second damascene layer 312A. Layer 322 serves as a seed layer for a PMR main pole plating. In one embodiment, seed layer 322 is deposited using an atomic layer deposition ("ALD") process. In an alternative embodiment, the non-magnetic gap layer 322 may be deposited using a chemical vapor deposition ("CVD") process. In one embodiment, seed layer 322 comprises Ruthenium ("Ru"). In other embodiments, the layer may comprise any material having sufficient conductivity and capable of serving as a seed layer for the upper magnetic materials (i.e. the PMR main pole layer).

The magnetic plating material is deposited over the seed layer 322 to form PMR pole layer 324. Plating material layer 324 (the PMR pole layer) fills trenches 307 and 313 of first damascene layer 306A and second damascene layer 312A. Pole layer 324 may be plated with a hard magnetic material. In the illustrated embodiment, Cobalt-Iron (CoFe) is used to the plate the PMR pole layer 324. In other embodiments Cobalt-Nickel-Iron (CoNiFe) may be used. In yet other embodiments, multiple layers may be used to plate the PMR pole layer. Following plating, a planarization process such as a CMP may remove layer 314A and any plating (and seed layer material) on top of the first and second damascene layers, thereby exposing the damascene layers. FIG. 9 illustrates the exposed damascene layers.

As illustrated in the top view of FIG. 9, there are non-conformal side gap regions 330 between the side shield region 310 and the tip of pole layer region 324. Depending on the placement and geometry of the side shield and VP3 resist masks in the above described processes, the variability of the width of side gap regions may be between 10 nm to 80 nm from the ABS region to the yoke region. In the illustrated embodiment, the side gap increases with side shield throat height. In other embodiments, the side gap may decrease with side shield throat height. In yet other embodiments, non-conformal side gap regions 330 may have areas of conformity (constant side gap distance) and areas of nonconformity (i.e. varying side gap distance).

At operation 216, a resist pattern layer 332 is formed over the substrate on hard mask layer 328. As illustrated in FIG. 10, the resist pattern layer 332 protects the main pole layer 324. An etching of hard mask layer 328, using resist pattern layer 332 as a hard mask, exposes side shield region 310 for etching processes (described below). Non-conformal side gap regions 330 are also exposed. Hard mask layer 328 may comprise Tantalum (Ta), Titanium (Ti), or any other material that has a high etching selectivity with respect to the underlying materials.

Following exposure of side shield region 310, etching processes may be performed in that region. At operation 218, the first layer of damascene material 306 is wet etched to remove the material in the side shield region 310 as illustrated in FIG. 11. In this exemplary embodiment, the etchant may be so configured to only remove the first layer of damascene material 306 in side shield region 310, but not remove any, some, or all of the second layer of damascene material 312 in non-conformal side gap regions 330. Following removal of first damascene layer 306, magnetic material 302 is exposed in side shield region 310. At operation 220, the magnetic material 302 is wet etched to remove the material in the side shield region 312, as illustrated in FIG. 12. In this exemplary embodiment, the etchant may be so configured to only remove magnetic material 302 in side shield region 310, but not remove any, some, or all of the second layer of damascene material 312 in non-conformal side gap regions 330.

Table 1, below, illustrates exemplary changes in the thickness of the second damascene layer 312 after example wet etching operations 218 and 220 with 30 minute etch time. In the particular embodiment illustrated by table 1, the first damascene layer 306 comprises Al2O3, the first magnetic material comprises NiFe, and the second damascene layer comprises SiO2.

TABLE 1

SiO2 non-etch performance

| Substrate | Etchant | Etch Time (min) | Pre-etch (nm) | Post-etch (nm) |
|---|---|---|---|---|
| Si/SiO2 | Al2O3 | 30 | 31.5 | 29.33 |
| Si/SiO2 | NiFe | 30 | 21.47 | 21.31 |

Following wet etching operations 218-220, side shield region 310 may be prepared for a plating process. At operation 222, the resist pattern layer 332 is lifted off in preparation for a shield region 310 plating. At operation 224, the side shield region is plated. The plating operation 214 may include depositing a seed layer 334 over layer 328. Layer 334 serves as a seed layer for shield plating. In one embodiment, seed layer 334 is deposited using an atomic layer deposition ("ALD") process. In an alternative embodiment, seed layer 334 may be deposited using a chemical vapor deposition ("CVD") process. In one embodiment, seed layer 334 comprises Ruthenium ("Ru"). In other embodiments, the layer may comprise any material having sufficient conductivity and capable of serving as a seed layer for the upper magnetic materials (i.e. the shield magnetic layer).

The magnetic plating material is deposited over the seed layer 334 to form side shield layer 336. In one embodiment, the same material used to plate PMR pole layer 324 is also used to plate side shield layer 336. In another embodiment, a different material is used. In one embodiment, Cobalt-Iron (CoFe) is used to plate side shield layer 336. In other embodiments Cobalt-Nickel-Iron (CoNiFe) may be used. In yet other embodiments, multiple layers may be used to plate the shield layer.

In the foregoing specification, embodiments of the disclosure have been described with reference to specific exemplary features thereof. It will, however, be evident that various modifications and changes may be made thereto without departing from the broader spirit and scope of the disclosure. The specification and figures are, accordingly, to be regarded in an illustrative rather than a restrictive sense.

What is claimed is:

1. A method for manufacturing a perpendicular magnetic recording (PMR) writer main pole with non-conformal side gaps, comprising:
    depositing a stitch layer comprising a magnetic material and a second stitch layer material over a substrate;
    forming an air-bearing surface (ABS) region in a first damascene material;
    forming a yoke region in a second damascene material comprising a different material than the first damascene material;
    wet etching the first damascene material to remove the first damascene material in a side shield region; and
    plating the side shield regions to form side shields;
    wherein the first damascene material comprises Aluminium Oxide ($Al_2O_3$) and the second damascene material comprises Silicon Dioxide ($SiO_2$);
    wherein the non-conformal side gap comprises $SiO_2$ and increases with the side shield throat height.

2. The method of claim 1, further comprising wet etching the magnetic material to remove it in a side shield region.

3. The method of claim 2, wherein the yoke region is between 100 nm and 600 nm behind the ABS.

4. The method of claim 1, wherein the magnetic material comprises Nickel-Iron (NiFe) and the second stitch layer material comprises Ruthenium (Ru).

5. The method of claim 1, wherein the ABS region and yoke region are formed by performing a reactive ion etch (RIE) on the Aluminium Dioxide ($AL_2O_3$) and Silicon-Dioxide (SiO2).

6. The method of claim 1, wherein the side gap varies in width between 10 nm and 80 nm from the ABS region to the yoke region.

7. A PMR writer main pole created by a process, the process comprising:
    depositing a stitch layer comprising a magnetic material and a second stitch layer material over a substrate;
    forming an air-bearing surface (ABS) region in a first damascene material;
    forming a yoke region in a second damascene material;
    wet etching the first damascene material to remove the first damascene material in a side shield region; and
    plating the side shield regions to form side shields;
    wherein the writer main pole has non-conformal side gaps;
    wherein the first damascene material comprises Aluminium Oxide ($Al_2O_3$) and the second damascene material comprises Silicon Dioxide ($SiO_2$);
    wherein the non-conformal side gap comprises $SiO_2$ and increases with the side shield throat height.

8. The PMR writer main pole of claim 7, the process further comprising wet etching the magnetic material to remove it in a side shield region.

9. The PMR writer main pole of claim 8, wherein the yoke region is between 100 nm and 600 nm behind the ABS.

10. The PMR writer main pole of claim 7, wherein the magnetic material comprises Nickel-Iron (NiFe) and the second stitch layer material comprises Ruthenium (Ru).

11. The PMR writer main pole of claim 7, wherein the ABS region and yoke region are formed by performing a reactive ion etch (RIE) on the Alumina ($AL_2O_3$).

12. The PMR writer main pole of claim 7, wherein the side gap varies in width between 10 nm and 80 nm from the ABS region to the yoke region.

* * * * *